(12) United States Patent
Narawade et al.

(10) Patent No.: US 11,063,597 B1
(45) Date of Patent: Jul. 13, 2021

(54) WIDE FREQUENCY RANGE STEP SIZE PROGRAMMABILITY FOR DELAY-LOCKED LOOPS USING VARIABLE BIAS VOLTAGE GENERATION

(71) Applicant: SiFive, Inc., San Mateo, CA (US)

(72) Inventors: Santosh Mahadeo Narawade, Bangalore (IN); Jithin K, Bangalore (IN); Mohit Gupta, San Jose, CA (US)

(73) Assignee: SiFive, Inc., San Mateo, CA (US)

( * ) Notice: Subject to any disclaimer, the term of this patent is extended or adjusted under 35 U.S.C. 154(b) by 0 days.

(21) Appl. No.: 16/827,969

(22) Filed: Mar. 24, 2020

(51) Int. Cl.
*H03L 7/081* (2006.01)
*H03L 7/085* (2006.01)
*H03K 5/134* (2014.01)
*H03L 7/07* (2006.01)

(52) U.S. Cl.
CPC .......... *H03L 7/0818* (2013.01); *H03K 5/134* (2014.07); *H03L 7/07* (2013.01); *H03L 7/085* (2013.01)

(58) Field of Classification Search
None
See application file for complete search history.

(56) References Cited

U.S. PATENT DOCUMENTS

| 7,705,647 | B2 | 4/2010 | Dai et al. | |
|---|---|---|---|---|
| 8,610,471 | B2 | 12/2013 | Kim et al. | |
| 8,766,688 | B2 | 7/2014 | Choi | |
| 2007/0018702 | A1* | 1/2007 | Lee | H03L 7/0802 327/158 |
| 2009/0189658 | A1* | 7/2009 | Tomar | H03L 7/0814 327/158 |
| 2010/0109722 | A1* | 5/2010 | Mai | H03L 7/10 327/142 |

* cited by examiner

*Primary Examiner* — Lincoln D Donovan
*Assistant Examiner* — Khareem E Almo
(74) *Attorney, Agent, or Firm* — Young Basile Hanlon & MacFarlane, P.C.

(57) ABSTRACT

Described is a delay-locked loop which includes a frontend circuit configured to output a control voltage based on an input clock and a feedback clock and a delay line circuit connected to the frontend circuit. The delay line circuit configured to generate a bias voltage based on the control voltage and a step size, where the bias voltage is variable based on the step size, and apply at least one level of delay on the input clock based on the bias voltage to generate an output clock, where the feedback clock being based on the output clock and where the input clock is aligned with the feedback clock by delaying the phase of the output clock until phase lock.

17 Claims, 3 Drawing Sheets

WIDE FREQUENCY RANGE STEP SIZE PROGRAMMABILITY FOR DELAY-LOCKED LOOPS USING VARIABLE BIAS VOLTAGE GENERATION

TECHNICAL FIELD

This disclosure relates to delay-locked loops (DLLs) and in particular, providing a wide frequency range of operation for DLLs using selectable bias generation to control step size.

BACKGROUND

A delay-locked loop (DLL) is used for phase synchronization of an input or reference clock with a system or output clock. The input clock and output clock have the same frequency. The DLL uses a delay line to delay the reference clock until its phase is aligned with the output clock. The DLL needs a wide frequency range of operation for wide delay programmability. The ratio of maximum to minimum frequency is key for applications such as High Bandwidth memory (HBM2E) and Double Data Rate 5 Synchronous Dynamic Random-Access Memory (DDR5). For example, the ratio for these types of applications is on the order of 80× with a delay range equal to 50 MHz to 4 GHz in order to have accurate data sampling. This is due to the half unit interval lock for the DLL clock. Using conventional techniques, the ratio remains at 10× even if low frequency jitter is ignored and high frequencies are optimized.

A step size in a DLL is the amount of delay that can be applied to an input signal. Step sizes for high frequency applications and low frequency applications differ. High frequencies use small step sizes for delay programmability. Conventional implementation of small step sizes having, for example, a range of 2 picoseconds to 100 picoseconds, and large step sizes having, for example, a range of 20 picoseconds to 400 picoseconds, necessitates the use of duplicate hardware and associated logic for each of the different step sizes. This adversely impacts the size of the area needed for the DLL, especially for 7 nm and smaller technologies. That is, existing architectures utilize a greater percentage of the area for wide delay range DLLs.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
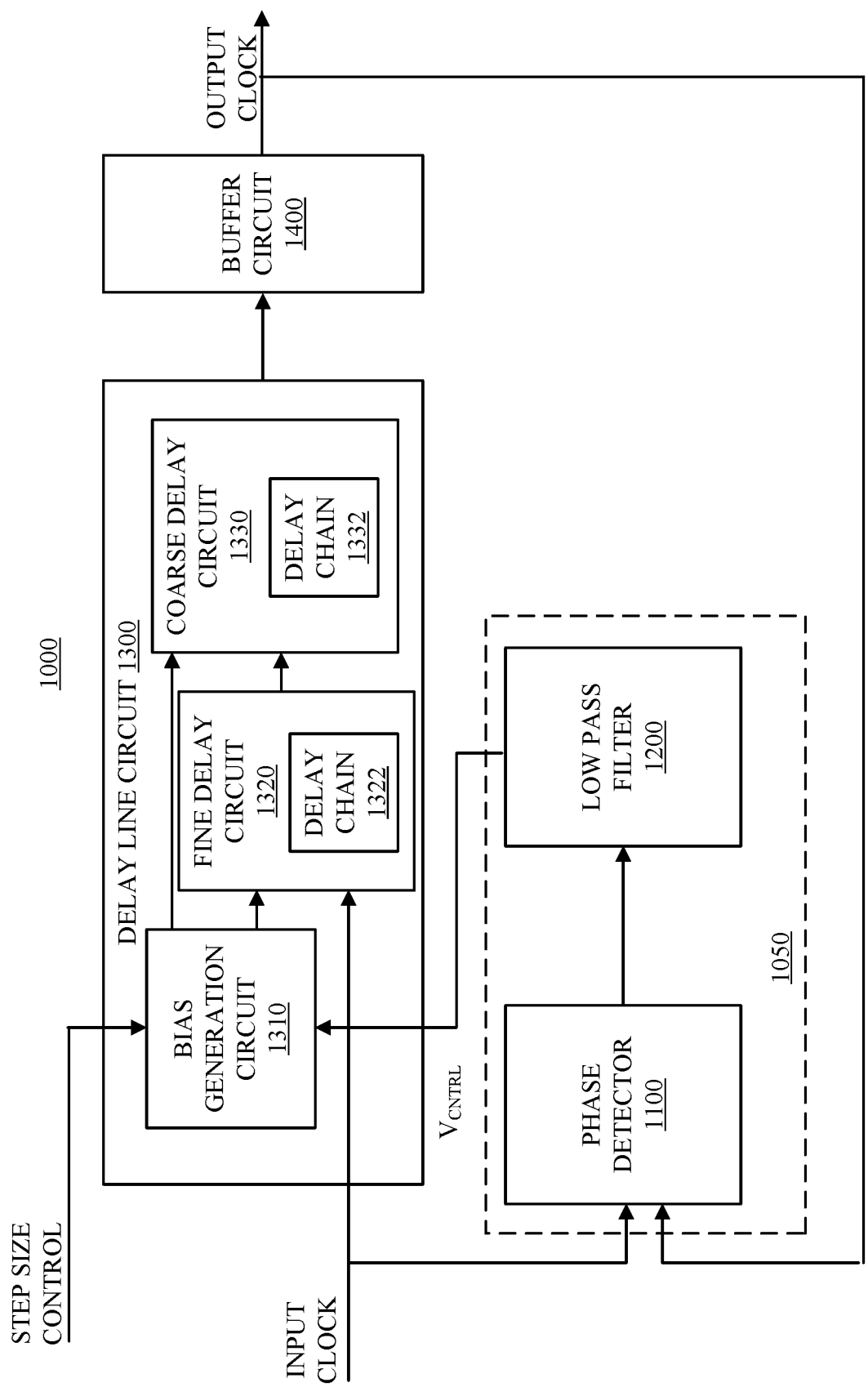
FIG. 1 is a block diagram of an example of a delay-locked loop (DLL) in accordance with embodiments of this disclosure.

Disclosed herein are circuits, systems and methods for providing wide frequency range step size programmability for delay-locked loops (DLLs) using variable bias generation. The DLL includes a frontend circuit configured to output a control voltage based on an input clock and a feedback clock and a delay line circuit connected to the frontend circuit. The delay line circuit configured to generate a bias voltage based on the control voltage and a step size, where the bias voltage is variable based on the step size, and apply at least one level of delay on the input clock based on the bias voltage to generate an output clock, where the feedback clock being based on the output clock and where the input clock being aligned with the feedback clock by delaying the phase of the output clock until phase lock.

In implementations, the bias generation circuit implements a stacked or parallel architecture for variable bias generation. A pair of stacked transistor sets are controlled by a step size control signal or bit field. In implementations, the step size control signal is a defined number of bits. A selected number of the transistors in a first stacked transistor set are turned on and a complementary number of transistors in the second stacked transistor set are turned on where the total number of turned on transistors is equal to the number of transistors in the first stacked transistor set. The number of transistors turned on/off at each of the stacked transistor sets controls generation of the bias current available or establishment of the bias voltage at the inputs of a fine delay circuit and a coarse delay circuit.

In implementations, increasing a value of the step size control signal, decreases an amount of bias current, and increases the step size. Fine step size accuracy is provided for higher frequencies and coarse step size is provided for lower frequencies. The same delay lines in the fine delay circuit and the coarse delay circuit can be used for high and low frequencies. Step size programmability is provided using less area as compared to conventional techniques.

In implementations, dynamic bias generation enables the amount of delay provided by a step to vary over a wide delay range so as to support DLL operability or tunability over a wide range of frequencies. For example, the range of frequencies can be 50 MHz to 2 GHz. In this instance, the range of delay can be from 20 nanoseconds to 500 picoseconds. The associated step sizes are then for example, 400 picoseconds and 10 picoseconds, respectively.

These and other aspects of the present disclosure are disclosed in the following detailed description, the appended claims, and the accompanying figures.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

The term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function. For example, the processor can be a circuit. For example, the processor can be a circuit.

As used herein, the terminology "determine" and "identify," or any variations thereof, includes selecting, ascertaining, computing, looking up, receiving, determining, establishing, obtaining, or otherwise identifying or determining in any manner whatsoever using one or more of the devices and methods shown and described herein.

As used herein, the terminology "example," "embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is, unless specified otherwise, or clear from context, "X includes A or B" is intended to indicate any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

It is to be understood that the figures and descriptions of embodiments have been simplified to illustrate elements that are relevant for a clear understanding, while eliminating, for the purpose of clarity, many other elements found in typical processors. Those of ordinary skill in the art may recognize that other elements and/or steps are desirable and/or required in implementing the present disclosure. However, because such elements and steps do not facilitate a better understanding of the present disclosure, a discussion of such elements and steps is not provided herein.

FIG. 1 is a block diagram of an example of a delay-locked loop (DLL) 1000 in accordance with embodiments of this disclosure. The DLL 1000 includes a front end circuit 1050 including a phase detector 1100 and a low pass filter 1200. The phase detector 1100 has an input connected to or in communication with (collectively "connected to") an input or reference clock and an output connected to the low pass filter 1200. The low pass filter 1200 outputs a control voltage ($V_{CNTRL}$) to a delay line circuit 1300. The delay line circuit 1300 includes a bias generation circuit 1310 connected to a fine delay circuit 1320 and a coarse delay circuit 1330. The fine delay circuit 1320 is connected to the coarse delay circuit 1330. Each of the fine delay circuit 1320 and the coarse delay circuit 1330 includes a delay chain or chain block 1322 and 1332, respectively, as is known to those of skill in the art.

The bias generation circuit 1310 inputs the $V_{CNTRL}$ signal and a step size control signal to generate and output a bias current or set a bias voltage for the fine delay circuit 1320 and the coarse delay circuit 1330. The bias current sets a fine step size or amount of delay applied by the fine delay circuit 1320 and a coarse step size or amount of delay applied by the coarse delay circuit 1330.

The fine delay circuit 1320 applies the step size or associated delay based on the bias current to the input clock and outputs a fine-delayed clock to the coarse delay circuit 1330. The coarse delay circuit 1330 applies the step size or associated delay based on the bias current to the fine-delayed clock and outputs a coarse-delayed clock. In implementations, the step size of the fine delay circuit 1320 and the coarse delay circuit 1330 are different. In implementations, the step size of the fine delay circuit 1320 is smaller relative to the step size of coarse delay circuit 1330. In implementations, a range associated with the step size of the fine delay circuit 1320 and a range associated with the step size of the coarse delay circuit 1330 are different. In implementations, a range associated with the step size of the fine delay circuit 1320 is from a minimum of 2 picoseconds to a maximum of 100 picoseconds and a range associated with the step size of the coarse delay circuit 1330 is a minimum of 20 picoseconds to a maximum of 400 picoseconds.

The buffer circuit 1400 receives the coarse-delay clock from the coarse delay circuit 1330 and provides a buffer for impact from output loading. The buffer circuit 1400 outputs an output clock, which is the output of the DLL 1000. The output clock is coupled back to the phase detector 1100 as a feedback clock. The DLL 1000 and each element or component in the DLL 1000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

Operationally, the PFD 1100 detects the phase differences between the input clock and the feedback clock and generates the $V_{CNTRL}$ via the low pass filter 1200. The $V_{CNTRL}$ and the step size control is processed by the bias generation circuit 1310 to generate the bias current. The fine delay circuit 1320 delays the input clock by the fine step size as determined by the bias current. The coarse delay circuit 1330 delays the fine-delayed clock by the coarse step size as determined by the bias current. That is, the step size can be dynamically changed or is variable depending on the bias current. The same fine delay circuit 1320 and the same coarse delay circuit 1330 can be used to generate different step sizes or delays. In implementations, a range of values of the step size control is associated with the number of delay lines in the delay chain 1322 and the delay chain 1332. In implementations, the number of delay lines in the delay chain 1322 and the delay chain 1332 are the same.

Figure 2:
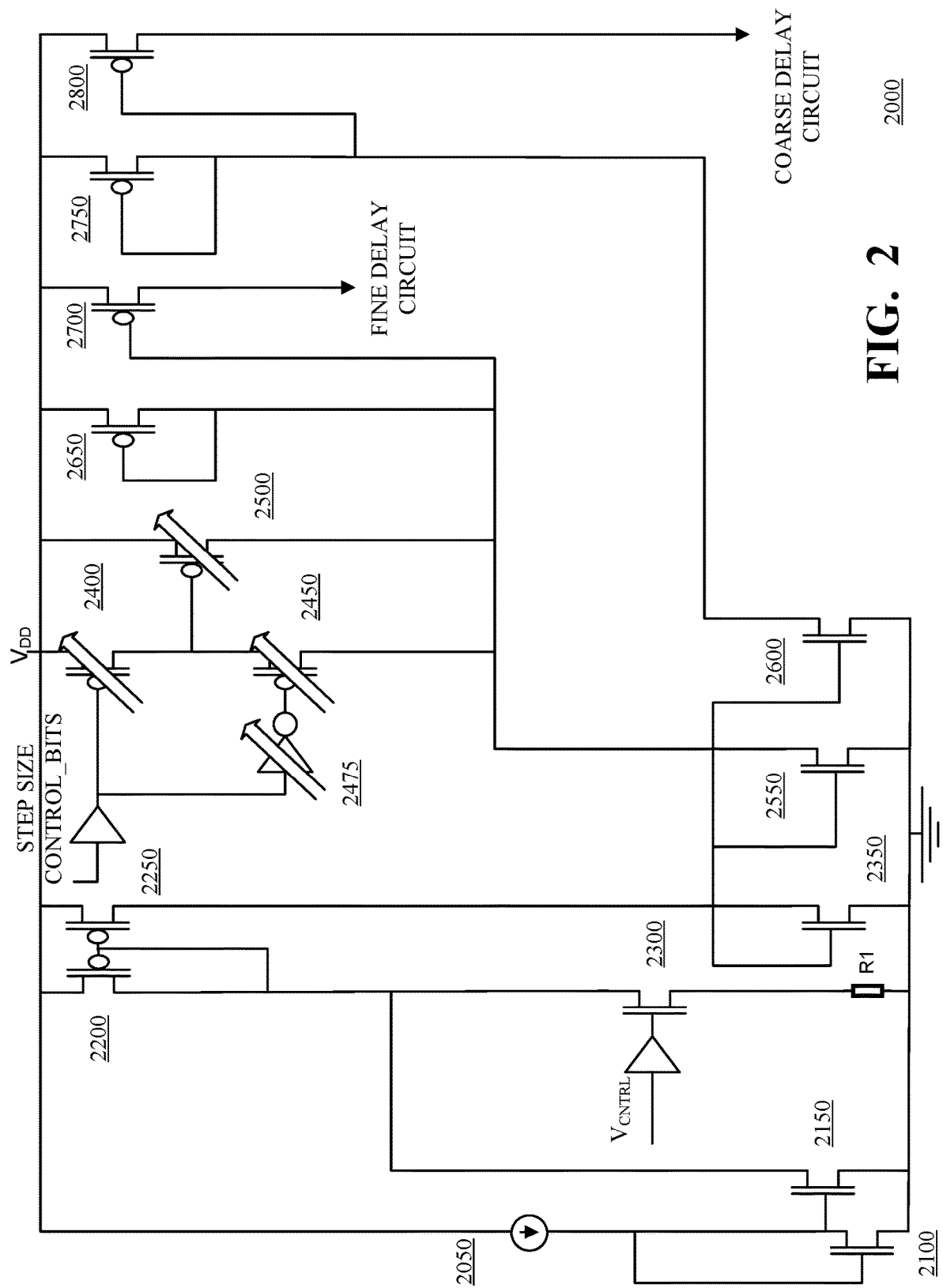
FIG. 2 is a block diagram of an example a variable bias generation circuit in accordance with embodiments of this disclosure.

FIG. 2 is a block diagram of an example a variable bias generation circuit 2000 in accordance with embodiments of this disclosure. The variable bias generation circuit 2000 includes a current source 2050 tied to a drain of a N-type metal-oxide-semiconductor (NMOS) transistor 2100 and to a voltage supply ($V_{DD}$). A gate of the NMOS transistor 2100 is tied to the drain of the NMOS transistor 2100. A source of the NMOS transistor 2100 is tied to ground. A gate of a NMOS transistor 2150 is tied to the drain of the NMOS transistor 2100. A source of the NMOS transistor 2150 is tied to ground. A drain of the NMOS transistor 2150 is tied to a drain of a P-type metal-oxide-semiconductor (PMOS) transistor 2200, which is also tied to a gate of the PMOS transistor 2200 and a gate of a PMOS transistor 2250. A source of the PMOS transistor 2200 and a source of the PMOS transistor 2250 are tied to $V_{DD}$. A L A MOS transistor 2300 has a drain tied to the drain of the PMOS transistor 2200 and a source tied ground via a resistor R1. A gate of the NMOS transistor 2300 is tied to $V_{CNTRL}$ output from a low pass filter of a DLL as shown and described in FIG. 1. A NMOS transistor 2350 has a drain tied to the drain of the PMOS transistor 2250 and a gate tied to the drain of the NMOS transistor 2350. A source of the NMOS transistor 2350 is tied to ground.

A PMOS transistor stack 2400 (where an arrow through the element represents a stack) have gates tied to a step size control input, which can be received from a controller, system controller, control device, control circuit and the like. The step size control input can have a defined range of values to set the step size. For example, the step size control input can be five bits and accordingly have 32 selectable levels or step sizes. The PMOS transistor stack 2400 is a defined number of PMOS transistors connected in parallel as described herein. The defined number is associated with the defined range of values of the step size control input. Sources of the PMOS transistor stack 2400 are tied to $V_{DD}$. A PMOS transistor stack 2450 have gates tied to the step size control input via an inverter gate stack 2475. The PMOS transistor stack 2450 is the defined number of PMOS transistors plus one PMOS transistor, which are connected in parallel as described herein. Sources of the PMOS transistor stack 2450 are tied to drains of the PMOS transistor stack 2400 and to gates of a PMOS transistor stack 2500. The PMOS transistor stack 2500 is the defined number of PMOS transistors. The drains of the PMOS transistor stack 2450 are tied to a drain of the NMOS transistor 2350, a drain of a NMOS transistor 2550, the drains of the PMOS transistor stack 2500, a drain of a PMOS transistor 2650, a gate of a PMOS transistor 2700, a drain of a PMOS transistor 2750, and a gate of PMOS transistor 2800. Sources of the PMOS transistor stack 2500 are tied to $V_{DD}$.

With respect to each element stack, copies of the circuitry including the inverter gate stack 2475, the PMOS transistor stack 2400, the PMOS transistor stack 2450, and the PMOS transistor stack 2500 (one copy for each bit of the step size control) are arranged and appropriately connected in parallel with each other between $V_{DD}$ and the drain of NMOS transistor 2550. The step size control selects which of the transistors in the PMOS transistor stack 2400 and the PMOS transistor stack 2450 are on. In implementations, the step size control is a signal bus line. In implementations, the step size control has a signal line to each transistor in the PMOS transistor stack 2400 and the PMOS transistor stack 2450. A NMOS transistor 2550 has a gate connected to the gate of the NMOS transistor 2350 and a gate of a NMOS transistor 2600. The gate of the NMOS transistor 2350 is connected to a drain of the NMOS 2350 and a drain of the PMOS 2250. A source of the NMOS transistor 2550 and a source of the NMOS transistor 2600 are tied to ground. A drain of the NMOS transistor 2600 is tied to a drain of the PMOS transistor 2750. A gate of the PMOS transistor 2650 is tied to the drain of the PMOS transistor 2650 and a source of the PMOS transistor 2650 is tied to $V_{DD}$. A source of the PMOS transistor 2700 is tied to $V_{DD}$. A drain of the PMOS transistor 2700 outputs a bias current or sets a bias voltage for a fine delay circuit as shown and described in FIG. 1. A gate of the PMOS transistor 2750 is tied to a drain of the PMOS transistor 2750 and a source of the PMOS transistor 2750 is tied to $V_{DD}$. A source of the PMOS transistor 2800 is tied to $V_{DD}$. A drain of the PMOS transistor 2800 outputs a bias current or sets a bias voltage for a coarse delay circuit as shown and described in FIG. 1. The variable bias generation circuit 2000 and each element or component in the variable bias generation circuit 2000 is illustrative and can include additional, fewer or different devices, entities, element, components, and the like which can be similarly or differently architected without departing from the scope of the specification and claims herein. Moreover, the illustrated devices, entities, element, and components can perform other functions without departing from the scope of the specification and claims herein.

Operationally, one transistor of the PMOS transistor stack 2450 is default on. For a given value of the step size control input, a number of stacked transistors of the PMOS transistor stack 2400 are on and a complementary number of the stacked transistors in the PMOS transistor stack 2450 are on. For an example of complementary, assume there are 32 transistors in each set. If one transistor is turned on in the PMOS transistor stack 2400, then 31 transistors are turned on in the PMOS transistor stack 2450 (in addition to the default transistor that is already on). As an example, the step size control input is a five-bit field for controlling the 32 transistors. The number of on and off transistors changes the gate-to-source voltage ($V_{GS}$) at each transistor in the PMOS transistor stack 2500, which in turn controls the bias current level output by the PMOS transistor 2700 and the PMOS transistor 2800. That is, the bias voltage is dynamically changing based on the step size control input. In implementations, as the value of the step size control input increases, the bias current decreases, and the step size increases. That is, the amount of delay increases. In conventional DLLs each step size requires a duplicate set of hardware. In contrast, the variable bias generation circuit 2000 and the DLL 1000 enables variable use of a defined chain block.

Figure 3:
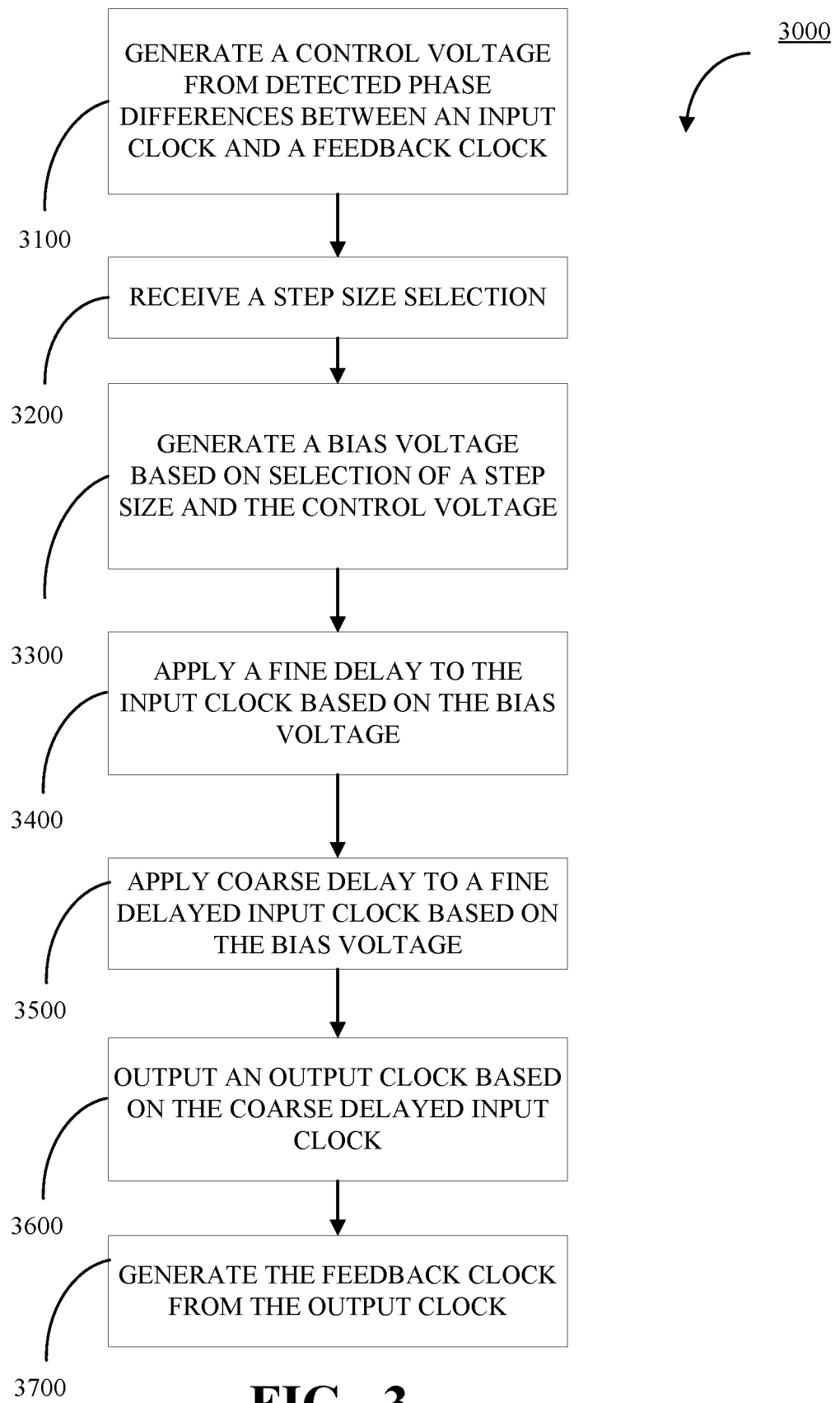
FIG. 3 is a diagram of an example technique for variable bias generation in DLLs in accordance with embodiments of this disclosure.

FIG. 3 is a diagram of an example technique 3000 for variable bias generation in DLLs in accordance with embodiments of this disclosure. The technique includes: generating 3100 a control voltage from detected phase differences between an input clock and a feedback clock; receiving 3200 a step size selection; generating 3300 a bias voltage based on selection of a step size and the control voltage; applying 3400 a fine delay to the input clock based on the bias voltage; applying 3500 a coarse delay to a fine delayed input clock based on the bias voltage; outputting 3600 an output clock based on the coarse delayed input clock; and generating 3700 the feedback clock from the output clock. The technique 3000 can be implemented, for example, in the DLL 1000 of FIG. 1, the variable bias generation circuit of FIG. 2, and like circuits, devices and systems.

The technique 3000 includes generating 3100 a control voltage from detected phase differences between an input clock and a feedback clock. A DLL attempts to synchronize phases of an input clock with a feedback clock by applying delay to the input clock.

The technique 3000 includes receiving 3200 a step size selection. The amount of delay to be applied to the input clock, the step size, is controllable. For example, a controller based on synchronizations times, level of error (difference between the input clock and the feedback clock) can increase or decrease the step size.

The technique 3000 includes generating 3300 a bias voltage based on selection of a step size and the control voltage. Selection of the step size turns on and off a number of transistors, which in turn generates the bias voltage. In implementations, the step size selection turns on a number of transistors in one set of transistors and turns off a complementary number of transistors in another set of transistors. For an example of complementary, assume there are 32 transistors in each set. If one transistor is turned on in one set of transistors, then 31 transistors are turned on in the other set of transistors.

The technique 3000 includes applying 3400 a fine delay to the input clock based on the bias voltage. The amount of delay applied by a delay circuit can be done at two levels, a fine delay level and a coarse delay level. Each level is implemented with a number of controllable delay elements in association with a range of step sizes that can be selected. Fine delay is applied to the input clock based on the bias voltage.

The technique 3000 includes applying 3500 a coarse delay to a fine delayed input clock based on the bias voltage. Coarse delay is applied to the fine delayed input clock based on the bias voltage where the coarse delay is greater than the fine delay.

The technique 3000 includes outputting 3600 an output clock based on the coarse delayed input clock. The output clock is based on or generated from the coarse delayed input clock.

The technique 3000 includes generating 3700 the feedback clock from the output clock. The output clock is feedback to the input of the DLL.

In an illustrative example, minimum to maximum delay simulation ranges from 0.5 picoseconds to 400 picoseconds per step were achieved. This provides good range for the fine delay with 32 settings. The lowest range remains at 16 picoseconds and maximum range equals 12 nanoseconds. The current source is modified in order to change the current every time the step size control bit or fine tune bit is advanced as the step size control bit reaches a maximum limit. In implementations, the maximum limit is 16. Fine step accuracy for higher frequencies, such as 1 picosecond is achieved. For lower frequencies step size of 400 picoseconds is achieved.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more computer readable mediums having computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A delay-locked loop comprising:
    a frontend circuit configured to output a control voltage based on an input clock and a feedback clock; and
    a delay line circuit connected to the frontend circuit, the delay line circuit configured to:
        generate a bias voltage based on the control voltage and a step size, wherein the bias voltage is variable based on the step size; and
        apply at least one level of delay on the input clock based on the bias voltage to generate an output clock, the feedback clock being based on the output clock;
    the delay line circuit comprising a bias generation circuit configured to:
        receive the step size and the control voltage; and
        turn on a number of transistors in a first set of transistors and turn on a complementary number of transistors in a second set of transistors to generate a source-to-gate voltage,
        wherein a set of stacked inverters is connected to an inverted step size and the second set of transistors;
    wherein the input clock is aligned with the feedback clock by delaying the phase of the output clock until phase lock.

2. The delay-locked loop of claim 1, the delay line circuit further comprises:
    a bias generation circuit configured to:
        turn on a number of transistors at a third set of transistors based on the source-to-gate voltage to generate the bias voltage,
        wherein a number of transistors in the first set, the second set, and the third set are defined by a number of selectable step sizes.

3. The delay-locked loop of claim 2, the bias generation circuit wherein:
    the first set of transistors is a stacked set of P-type metal-oxide-semiconductor (PMOS) transistors arranged in parallel between a supply voltage and a transistor drain, the first set of transistors connected to the step size;
    the second set of transistors is a stacked set of PMOS transistors arranged in parallel between the supply voltage and the transistor drain, the second set of transistors connected to an inverted step size; and
    the third set of transistors is a stacked set PMOS transistors arranged in parallel between the supply voltage and the transistor drain, the third set of transistors connected to the first set of transistors and the second set of transistors.

4. The delay-locked loop of claim 3, the bias generation circuit further comprises:
    a first PMOS transistor connected to the third set of transistors for outputting the bias voltage to the fine delay circuit; and
    a second PMOS transistor connected to the third set of transistors for outputting the bias voltage to the coarse delay circuit.

5. The delay-locked loop of claim 3, the frontend circuit further comprises:
    a phase detector configured to output a difference signal based on the input clock with the feedback clock; and
    a low pass filter connected to the phase detector, the low pass filter configured to output the control voltage based on the difference signal.

6. A method comprising:
    generating a control voltage from detected phase differences between an input clock and a feedback clock;
    generating a bias voltage based on selection of a step size and the control voltage, wherein the generating further including:
        turning on a number of transistors in a first set of stacked transistors using the step size and turning on a complementary number of transistors in a second set of stacked transistors to generate a source-to-gate voltage using an inverted step size and wherein a number of transistors in the first set and the second set are defined by a number of selectable step sizes;
    applying at least one delay to the input clock based on the bias voltage, wherein the applying further including:
        applying a stack of inverters to the second set of transistors and to the step size to generate the inverted step size; and
    generating the feedback clock from the output clock.

7. The method of claim 6, wherein the generating further comprises turning on a number of transistors in a third set of stacked transistors to generate the bias voltage.

8. The method of claim 6, wherein the applying further comprises:
    applying a stack of inverters to the step size to generate the inverted step size.

9. A device comprising:
    a detector circuit configured to output a phase difference voltage based on an input clock and a feedback clock;
    an adjustable bias voltage generation circuit connected to the detector circuit, the adjustable bias voltage generation circuit configured to:
        receive selection of a step size; and
        set an adjustable bias voltage based on the control voltage and the step size,
        wherein the adjustable bias voltage generation circuit includes:
            a first set of stacked transistors connected to the step size;
            a second set of stacked transistors connected to an inverted step size; and
            a set of stacked inverters connected to the inverted step size and the second set of transistors; and
    a delay circuit connected to the adjustable bias voltage generation circuit, the delay circuit configured to apply at least one level of delay based on a bias voltage to the input clock to generate an output clock, the feedback clock being based on the output clock, wherein the input clock is aligned with the feedback clock by delaying the phase of the output clock until phase lock.

10. The device of claim 9, the adjustable bias voltage generation circuit further comprises:

the first set of stacked transistors arranged in parallel between a supply voltage and a transistor drain;

the second set of transistors arranged in parallel between the supply voltage and the transistor drain; and a third set of stacked transistors which are arranged in parallel between the supply voltage and the transistor drain, the third set of stacked transistors connected to the first set of stacked transistors and the second set of stacked transistors, wherein the adjustable bias voltage generation circuit further configured to:

turn on a number of transistors in the first set of stacked transistors;

turn on a complementary number of transistors in the second set of stacked transistors to generate a source-to-gate voltage; and turn on a number of transistors in the third set of stacked transistors based on the source-to-gate voltage to generate the bias voltage, wherein a number of transistors in the first set, the second set, and the third set are defined by a number of selectable step sizes.

11. The delay-locked loop of claim 2, the adjustable bias voltage generation circuit further comprises:

a first PMOS transistor connected to the third set of stacked transistors for outputting the bias voltage to the fine delay circuit; and a second PMOS transistor connected to the third set of stacked transistors for outputting the bias voltage to the coarse delay circuit.

12. The delay-locked loop of claim 2, the delay line circuit further comprises:

a fine delay circuit configured to apply a fine delay to the input clock based on the step size.

13. The delay-locked loop of claim 12, the delay line circuit further comprises:

a coarse delay circuit configured to apply a coarse delay to a fine delayed input clock based on the step size.

14. The method of claim 6, wherein the applying further comprises:

applying a fine delay to the input clock associated with the step size.

15. The method of claim 14, wherein the applying further comprises:

applying a coarse delay to a fine delayed input clock associated with the step size.

16. The device of claim 9, the delay circuit further comprises:

a fine delay circuit configured to apply a fine delay to the input clock based on the step size.

17. The device of claim 16, the delay circuit further comprises:

a coarse delay circuit configured to apply a coarse delay to a fine delayed input clock based on the step size.

* * * * *